United States Patent [19]

Rauch

[11] 4,223,224
[45] Sep. 16, 1980

[54] CHARGED-PARTICLE BEAM OPTICAL APPARATUS INCLUDING A DAMPED SUPPLEMENTAL OSCILLATOR FOR THE SPECIMEN HOLDER THEREOF

[75] Inventor: Moriz v. Rauch, Berlin, Fed. Rep. of Germany

[73] Assignee: Siemens Aktiengesellschaft, Munich, Fed. Rep. of Germany

[21] Appl. No.: 946,863

[22] Filed: Sep. 29, 1978

[30] Foreign Application Priority Data

Sep. 30, 1977 [DE] Fed. Rep. of Germany ....... 2744680

[51] Int. Cl.$^2$ ........................................... G21K 5/06
[52] U.S. Cl. ................................... 250/442; 250/440
[58] Field of Search .............. 250/439, 440, 442, 444, 250/446, 456, 311; 248/358, 18

[56] References Cited

U.S. PATENT DOCUMENTS

| | | | |
|---|---|---|---|
| 3,521,056 | 7/1970 | Suzuki | 250/442 |
| 3,628,013 | 12/1971 | Heide | 250/442 |
| 4,058,731 | 11/1977 | Müller et al. | 250/442 |

*Primary Examiner*—Bruce C. Anderson
*Attorney, Agent, or Firm*—Kenyon & Kenyon

[57] ABSTRACT

An improved charged-particle beam optical apparatus including a specimen holder which is mounted in at least one support member of the apparatus and vibrates when the support member is subjected to shock. The improvement of the invention comprises at least one damped supplemental oscillator coupled to the specimen holder at approximately the point of maximum vibration amplitude of the holder.

7 Claims, 9 Drawing Figures

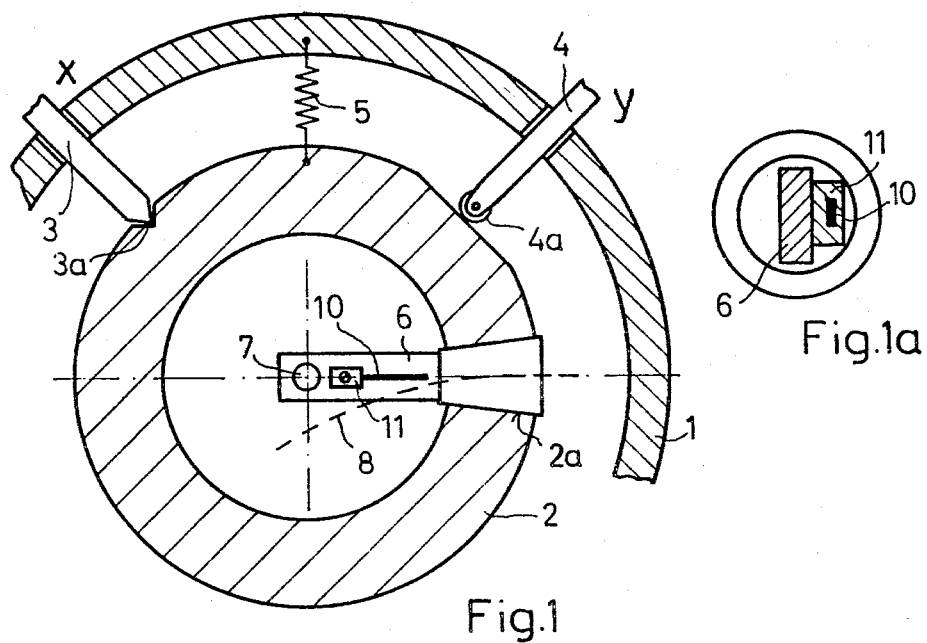
Fig.1
Fig.1a
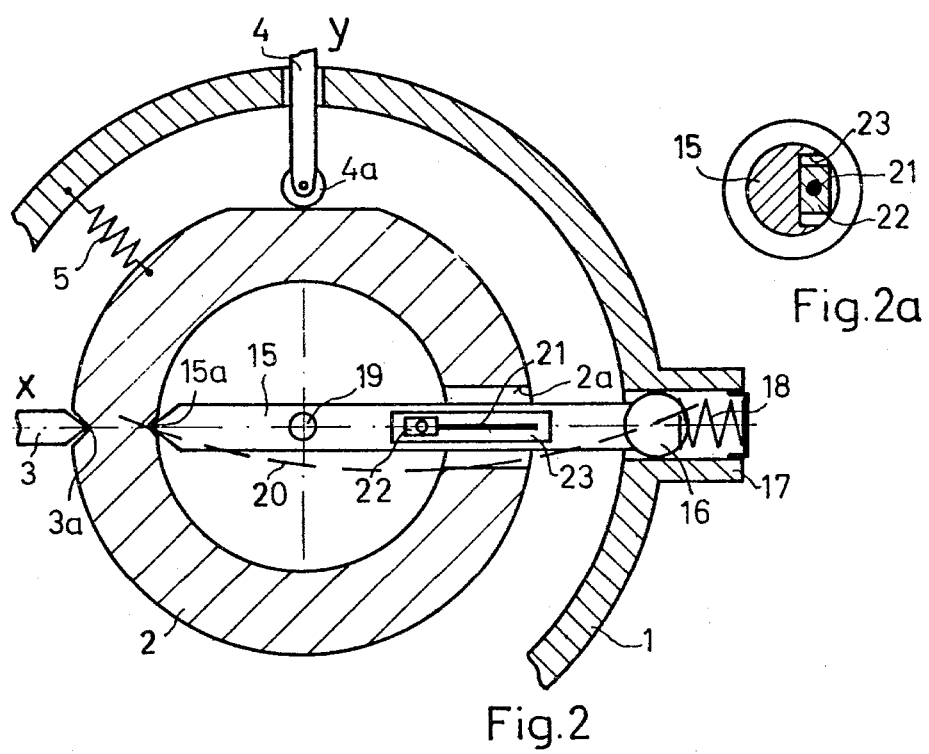
Fig.2
Fig.2a

CHARGED-PARTICLE BEAM OPTICAL APPARATUS INCLUDING A DAMPED SUPPLEMENTAL OSCILLATOR FOR THE SPECIMEN HOLDER THEREOF

BACKGROUND OF THE INVENTION

1. Field of the Invention

This invention relates to a charged-particle beam optical apparatus including a specimen holder which is mounted in at least one support member of the apparatus and vibrates when the support member is subjected to shock.

2. Description of the Prior Art

Charged-particle beam optical apparatus of the foregoing type are known in the art. See, for example, U.S. Pat. No. 4,058,731 which relates to an electron microscope of the foregoing type. The cause of such vibrations are, among other things, interfering soil vibrations which are first transmitted to the housing of the charged-particle beam optical apparatus and from there via the support of the specimen holder to the latter itself. At the support of the specimen holder, these interfering soil vibrations have on the average an amplitude between 1 and 10 μm. The vibrations are transmitted to the housing and the support in a most pronounced manner if the frequency of the vibrations is in the neighborhood of the resonance frequency of the housing support, namely 1 to 10 Hz, and resonance peaking is then obtained. The reason a resolution of a few Ångstroems is possible in electron microscopes in spite of a vibration amplitude of the specimen holder of several μm is the friction coupling of the important parts of such microscopes to each other which vibrate in phase and with the same amplitude. Thus, for example, part of the specimen holder is mounted, friction-coupled, in its support which in turn can be mounted, friction-coupled, on a specimen stage. The specimen stage in turn rests, friction-coupled, on the upper pole piece of the objective lens of the particle beam apparatus.

Elongated parts of the specimen holder which are not friction-coupled to adjacent parts, on the other hand, can be excited by the support vibrations to resonance vibrations which lead to a change of position of these parts of the specimen holder relative to the support of the specimen holder. If, for example, the specimen holder consists of a rod which passes through the wall of the electron microscope and is secured there in a first support and the other end of which, situated in the interior of the apparatus, engages a counter-support which is part of an adjustable specimen stage, then the portion of the rod-shaped specimen holder between the two supports can be excited to flexural vibrations in the two directions perpendicular to the rod axis. Additional vibrations can also be excited in the rod direction since at least one support must have spring action in the rod direction for adjusting the specimen holder in this direction without play.

The higher the resolution or the accelerating voltage of the electron microscope, the thicker the required magnetic lenses of the microscope must be. This, however, leads to a longer rod-shaped specimen holder and, thus, to a lowering of its resonance frequency. This resonance frequency thereby approaches the resonance frequency of the microscope column, whereby the vibrations of the latter are again transmitted more strongly to the rod-shaped specimen holder.

For maximum resolution (1 Å), the position of the specimen must not change more than 0.1 Å. Since the amplitude ratio of the interfering vibration of the specimen holder to the forcing support vibration is inversely proportional to the square of the lowest resonance frequency to the excitation frequency, it has already been attempted to make the amplitude of the interfering specimen holder vibration small by keeping the vibration frequency of the column low compared to the resonance frequency of the specimen holder vibration. For this purpose, a low-frequency microscope support, for example, an elaborate air spring system, is known.

SUMMARY OF THE INVENTION

It is therefore an object of the present invention to overcome the aforementioned disadvantages of heretofore known apparatus and to provide an improved charged-particle beam optical apparatus in which the interfering amplitude of the non-frictionally coupled parts of the specimen holder is limited to a degree permissible for maximum resolution in a simple manner and independently of position.

These and other objects of the invention are achieved in a charged-particle beam optical apparatus including a specimen holder which is mounted in at least one support member of the apparatus and vibrates when the support member is subjected to shock. The improvement comprises at least one damped supplemental oscillator means coupled to the specimen holder at approximately the point of maximum vibration amplitude of the specimen holder.

Attaching the supplemental oscillator, i.e., vibration damper, of the invention to the specimen holder approximately at the point of maximum vibration amplitude, i.e., vibration antinode, contrary to known low-frequency supports through which it has been attempted to eliminate the undesired vibration of the specimen holder by either selecting a location with extremely low soil vibrations or by not allowing the soil vibrations to be transmitted to the charged-particle beam optical apparatus itself by an elaborate air spring system, eliminates the effect of the interfering soil vibrations in the immediate vicinity of the specimen.

The principle of such damped supplemental oscillators is known. The resonance frequency of the supplemental oscillator in this invention is in the vicinity of the resonance frequency of the specimen holder. With optimum damping, a flat amplitude response curve is obtained with respect to the interference frequency without pronounced resonance maxima. The interference vibrations of the specimen holder are best suppressed with a given mass ratio $\rho = m_Z/m_S$, where $m_Z$ represents the mass of the supplemental oscillator and $m_S$ the mass of the specimen holder which is free to vibrate, when the damping $\phi$ of the supplemental oscillator and the frequency ratio $\alpha$ of the resonance frequency of the supplemental oscillator to the resonance frequency of the free-swinging part of the specimen holder are optimally set. According to "Shock and Vibration Handbook" by Harris and Crede, 2nd Ed., 1976, Section 6, pages 1 to 17, optimum damping is obtained in accordance with the equation $\phi = (\mu/2(1+\mu))^{\frac{1}{2}}$ and the optimum frequency ratio from the equation $\alpha_{opt} = 1/(1+\mu)$.

Examples of applications of damped supplemental oscillators are bridges and foundations of buildings. Supplemental oscillators are also known in connection with open-air power lines in which case a rod spring is fastened at one end to the open-air line; at the other end the line has a plate as a swinging mass. The amplitudes of the vibrations of this plate are damped by the air resistance exerted on the plate. It is also known to provide for tubular bus bar lines a tri-axial undamped or also damped supplemental oscillator in the interior of the tubular line. See German Pat. No. 20 56 164.

In all known examples, the amplitudes of the interference vibrations to be reduced are in the centimeter, or at least in the millimeter range. The purpose of a vibration damper on the specimen holder of a charged-particle beam optical apparatus, on the other hand, is to limit vibration amplitude to a value of a few tenths of an Ångstroem. If the interfering specimen holder vibrations occur only in one direction, then only a uniaxially damped supplemental oscillator is necessary to reduce them. Suitable for this purpose is, for example, a leaf spring which can be considered rigid for all practical purposes in the plane of the spring leaf and is resilient only perpendicular to this plane. If interference vibrations along several axes must be suppressed, or at least if their amplitudes are to be reduced, then a separate uniaxial supplemental oscillator can be provided for each axis. It is more advantageous in such a case, however, to use a single, multi-axial supplemental oscillator.

For a rod-shaped unilaterally supported specimen holder, it is advantageous if the supplemental oscillator is bi-axial and comprises a spring rod which is unilaterally fastened to such a specimen holder and is surrounded by energy-consuming material, and the resonance frequencies of which are approximately equal in both axes to the corresponding resonance frequencies of the specimen holder. It is assumed in this case that the rod-shaped specimen holder does not vibrate with an objectionable amplitude in the rod direction. The two possible directions of vibration of this specimen holder are in the plane perpendicular to the axis of the rod. The possible directions of vibration of the supplemental oscillator must also lie in the same plane, which is achieved by disposing the supplemental oscillator parallel to the rod-shaped specimen holder. To the extent possible, the supplemental oscillator should be fastened in the vicinity of the free end of the specimen holder, since in the case of a cantilevered rod, a vibration antinode is located at this point and, thus, a maximum amount of energy is transmitted to the supplemental oscillator. If the rod-shaped specimen holder has a rectangular-shaped cross-section, then different resonance frequencies are obtained due to the different spring stiffness in the two principal directions parallel to the sides of the cross-section. For optimum effectiveness of the supplemental oscillator in the two axes, i.e., in this case, in the two principal directions, it has been found to be most advantageous if the supplemental oscillator also has a rectangular-shaped cross-section with approximately the same sides ratio as the specimen holder. With appropriate length and appropriate choice of material, i.e., a specific modul of elasticity and specific weight, the resonance frequencies of the supplemental oscillator in the two principal directions will again be close to the corresponding resonance frequencies of the specimen holder. However, this also means that, with all other parameters entering into the equation for the resonance frequency being constant, the ratio of the area moments of inertia in the two axes of the supplemental oscillator must be approximately equal to the corresponding ratio of the area moments of inertia of the specimen holder.

Material suitable for the supplemental oscillator includes all non-magnetic, resilient materials such as alloy steel, bronze, tungsten or vanadium. The material directly surrounding the supplemental oscillator must consume energy when deformed in order to have a damping effect. This material may comprise, for example, natural or synthetic rubber or fluorine-containing polymers such as, for example, polytetrafluoroethylene. A material which develops little gas in a high vacuum is preferred. Besides the mentioned and similar materials, it is also possible to apply to the supplemental oscillator a thick layer of varnish or lead.

If the vibrating part of the specimen holder has a circular cross-section, it is then advantageous if the rod forming the supplemental oscillator also has circular cross-section and a tube of elastomer material is shrunk onto the rod. With a correspondingly small mass ratio $\mu$ of the mass of the supplemental oscillator $m_Z$ and the vibrating mass $m_S$ of the specimen holder, the supplemental oscillator can consist in the simplest case of a spring wire. This wire may, for example, be soldered at one end to a holder which is screwed to the rod.

In one embodiment of the invention, a weight is movably disposed on the rod. This weight may comprise, for example, nuts which are screwed with a tight fit on a section of the rod provided with a thread. By means of this additional movable weight, the resonance frequency of the supplemental oscillator can be varied and can therefore be adapted more easily to the optimal conditions for reducing the amplitude of the interference vibrations.

If the interfering vibrations of the specimen holder are to be reduced in all three spatial directions, an advantageous further embodiment of the invention is obtained if the supplemental oscillator is tri-axial and consists of a rigid mass which is located in the center of a mass which is resilient in all three axes and consists of energy-consuming material, and if the resonance frequency of the supplemental oscillator in the individual axes is approximately equal to the corresponding resonance frequencies of the specimen holder. Again, a single supplemental oscillator is sufficient. This tri-axial supplemental oscillator can be attached to the specimen holder in a particularly simple manner if the latter is at least partially tubular shaped. The supplemental oscillator is then located inside this tube, the outer rim of the resilient and energy-consuming mass being rigidly connected to the inside wall of the tube. This supplemental oscillator may comprise, for example, a sphere of elastomer material in the center of which a piece of metal is located as the rigid vibrating mass. Likewise, the shape of the supplemental oscillator may be that of a disc which is also constructed of an elastomer and contains in the center a rigid mass comprising, for example, metal. The dimensions of this supplemental oscillator depend on the required resonance frequencies in the different directions.

These and other novel features and advantages of the invention will be discussed in greater detail in the following detailed description.

BRIEF DESCRIPTION OF THE DRAWINGS

In the drawings, wherein similar reference numerals denote similar elements throughout the several views thereof:

FIG. 1 is a partial, cross-sectional view of a charged-particle beam optical apparatus including a specimen holder constructed according to the present invention;

FIG. 1a is a cross-sectional view of the specimen holder of the apparatus illustrated in FIG. 1;

FIG. 2 is another embodiment of a charged-particle beam optical apparatus including a specimen holder constructed according to the present invention;

FIG. 2a is a cross-sectional view of the specimen holder of the apparatus illustrated in FIG. 2;

DETAILED DESCRIPTION

Figure 3:
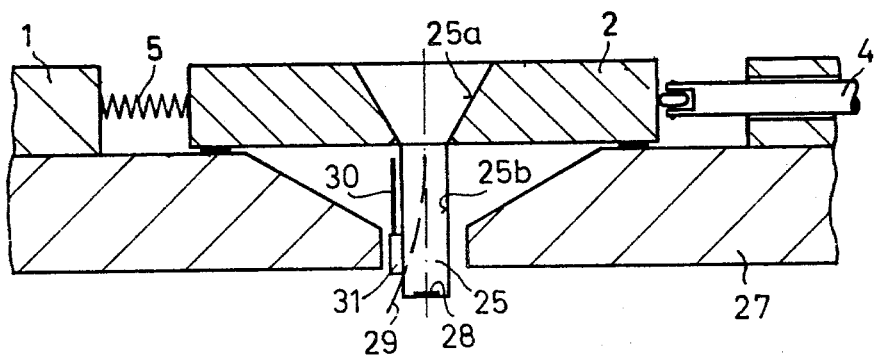
FIG. 3 is a further embodiment of a charged-particle beam optical apparatus including a specimen holder constructed according to the present invention.

Referring now to the drawings, FIG. 1 shows a cross-section through an electron microscope perpendicular to the beam direction in the plane of the specimen holder. The housing, which can be evacuated, is identified by reference numeral 1. In this housing is located a specimen stage 2. This specimen stage is moved by two drive plungers 3 and 4 which pass through the wall of the housing in a vacuum-tight manner, in the plane defined by plungers 3 and 4. Between specimen stage 2 and plungers 3 and 4 is a positive force transmission which is maintained by a tension spring 5. Plunger 3 has a point 3a which engages a wedge-shaped depression provided in specimen stage 2. Plunger 4 is equipped with a roller 4a which rolls on a plane counter-surface of specimen stage 2. It should be noted, however, that any other cross feed can be used instead of this specimen stage drive.

Specimen stage 2 has a conical opening 2a into which rod-shaped specimen holder 6 is inserted. For inserting and removing specimen holder 6, the wall of housing 1 is equipped at the proper point with a lock (not shown for the purpose of simplification). At its forward end, specimen holder 6 has an opening for a specimen. Reference numeral 8 identifies the bending line of the fundamental vibration of this rod-shaped, unilaterally supported specimen holder. The vibration antinode of this fundamental vibration is located at the free end of the specimen holder. However, since opening 7 for the specimen itself is located at this point, supplemental oscillator 10 cannot be mounted directly at the location of the vibration antinode. However, it is fastened in a holder 11 as close as possible to the specimen and therefore still in the region of large vibration amplitudes.

FIG. 1a shows a cross-section through specimen holder 6 and supplemental oscillator 10 perpendicular to the plane of the drawing. As can be seen from this figure, specimen holder 6 has a rectangular-shaped cross-section. The two circular lines around holder 6 are projections of the inner and outer areas of the conical part of the holder seated in specimen stage 2. Specimen holder 6 includes a holder 11 for receiving the supplemental oscillator. In accordance with the shape of the cross-section of holder 6, supplemental oscillator 10 is also rectangular-shaped with the same sides ratio as specimen holder 6. This assures that the resonance frequencies of specimen holder 6 and supplemental oscillator 10 are approximately equal in the two preferred directions, i.e., along the two rectangle sides.

FIG. 2 shows a cross-section through another embodiment of an electron microscope in the plane of the specimen holder. This microscope includes an annular-shaped adjustable specimen stage 2 including an aperture 2a for permitting the passage of a specimen holder 1 therethrough. The specimen holder 15 is rod-shaped, but contrary to the embodiment of the apparatus illustrated in FIG. 1, passes through the wall of housing 1 and is secured in this wall in a first support 16, shown simply as a sphere for the purpose of simplification. Besides support action, this sphere also has a sealing effect. The other end of specimen holder 15 has a point 15a which engages a correspondingly shaped conical depression in specimen stage 2. In the vicinity of first support 16, housing 1 is provided with a cylinder 17 which accommodates a compression spring 18. Due to this compression spring 18, positive force transmission always exists between point 15a of specimen holder 15 and the specimen stage. Cylinder 17 leads to a lock (not shown).

Specimen holder 15 has a bore hole 19 at the point of the electron beam for receiving the specimen. Reference numeral 20 identifies the bending line of the fundamental vibration of the specimen holder in the plane of the section and perpendicular to the axis of the specimen holder. The base of a supplemental oscillator 21 is located at the point of the vibration antinode and consists of a block 22 screwed to the specimen holder 15 which receives supplemental oscillator 21. To receive block 22 and supplemental oscillator 21, specimen holder 15 is provided with a slot 23 in this region.

FIG. 2a shows a cross-section through specimen holder 15 and supplemental oscillator 21 perpendicular to the plane of the drawing. The cross-section of holder 15 is circular in this embodiment and only the region of the slot deviates somewhat from this shape. Supplemental oscillator 21 mounted in block 22 also has a circular cross-section and consists of a bronze wire onto which a tube of polytetrafluoroethylene is shrunk. If specimen holder 15 is excited to resonance vibration, for example, by soil vibrations, then supplemental oscillator 21 also starts to vibrate. The polytetrafluoroethylene tube applied to the bronze wire is then deformed inelastically, i.e., energy is consumed, and supplemental oscillator 21 is damped thereby.

The mass of supplemental oscillator 21 can be very small compared to the mass of specimen holder 15. With a fixed mass ratio $\mu = m_Z/m_S$, optimum suppression of the interfering specimen holder vibration is obtained if the damping $\phi = (\mu/2(1+\mu))^{\frac{1}{2}}$ and if at the same time the frequency ratio $\alpha = f_Z/f_S = 1/(1+\mu)$, where $f_Z$ represents the resonance frequency of the supplemental oscillator and $f_S$ the resonance frequency of the specimen holder. If, for example, $\mu = 10^{-3}$ is set as the mass ratio, then an optimum damping $\phi_{opt} \approx 0.02$ and an optimum frequency ratio $\alpha_{opt} \approx 0.999$. The resonance frequency of the supplemental oscillator is therefore only 0.1% higher than that of the specimen holder.

In the embodiments of the apparatus shown in FIGS. 1 and 2, two rod-shaped specimen holders 6 and 15, respectively, for laterally inserting a specimen into an electron microscope were shown. FIG. 3 shows an embodiment in which a specimen holder 25 is inserted into the specimen stage in the direction of the electron beam. Coupled by means of a slide ring, specimen stage 2 rests on the upper part of an objective pole piece 27. By means of plungers 3 and 4, of which only plunger 4 is visible in FIG. 3, as well as spring 5, the specimen stage is movable in the plane perpendicular to the electron beam. In this embodiment, a specimen cartridge with a conical upper part 25a and a tube 25b which extends to the point of maximum field strength in the pole piece gap serves as the specimen holder. Specimen 28 is fastened at that point. Conical part 25a of specimen holder 25 is connected to specimen stage 2 by friction and can therefore vibrate with the latter only in synchronism. Tube 25b, however, can be excited to vibrations which can lead to a change of position relative to the specimen stage and the objective pole piece 27. Reference numeral 29 identifies the flexing line of the first resonance frequency. The base of a bi-axial supplemental oscillator 30, which is connected to specimen holder 25 by means of a housing 31, is located approximately at the point of the vibration antinode, which means in this case, however, also at the point of specimen 28.

Figure 4:
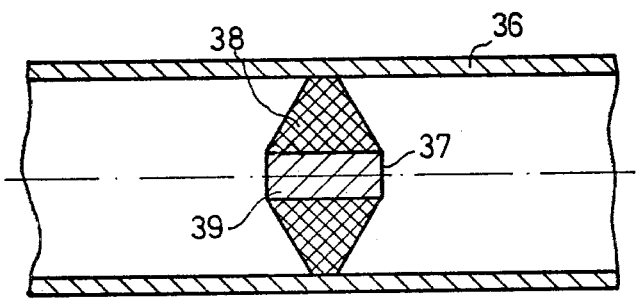
FIG. 4 is a cross-sectional view of a specimen holder constructed according to the present invention in which the specimen holder is tubular in shape and includes a tri-axial supplemental oscillator.

FIG. 4 shows a section of a specimen holder which is of tubular design, at least in the portion shown. In the interior of tube 36 is disposed a tri-axial supplemental oscillator 37 which in this embodiment consists of a disc-shaped rubber mass 38, in the center of which a mass 39 is disposed so that it can vibrate. The latter mass may comprise brass or alloy steel. This tubular section of the specimen holder could be, for example, part of specimen holder 6 or part of specimen holder 15. The bi-axial vibration damper used in the embodiments shown in the drawings could then be eliminated. The reason it may be necessary under some conditions to employ a tri-axial vibration damper with such rod-shaped specimen holders although it can be assumed that the rod-shaped specimen holder itself is rigid in the rod direction, is that in the apparatus shown in FIG. 1, specimen stage 2 can vibrate in the direction of the rod-shaped specimen holder in such a manner that the ring diameter changes periodically in this direction, and in the embodiment shown in FIG. 2 rod 15 vibrates against rod point 15a, which can be considered as a spring.

Figure 5:
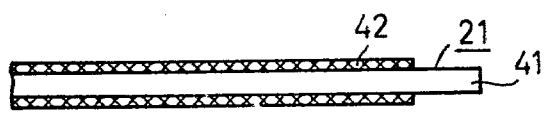
FIG. 5 is a cross-sectional view of one embodiment of a bi-axial supplemental oscillator constructed according to the present invention.

FIG. 5 shows an enlarged view of a rod-shaped supplemental oscillator 21 which consists of a spring wire 41 surrounded by a jacket of elastomer, for example, of polytetrafluoroethylene or synthetic rubber.

Figure 6:
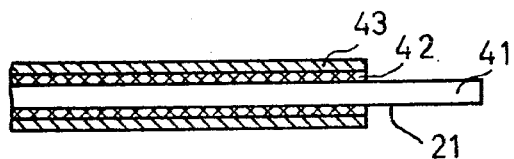
FIG. 6 is a cross-sectional view of another embodiment of a bi-axial supplemental oscillator constructed according to the present invention.

FIG. 6 shows another embodiment of supplemental oscillator 21, which consists again of spring wire 41. In this embodiment, wire 41 is surrounded not only by a jacket 42 of elastomer, but also by a metal cylinder 43. A deformation of the elastomer between wire 41 and metal cylinder 43 occurs and thereby, vibration damping, when wire 41 vibrates.

Figure 7:
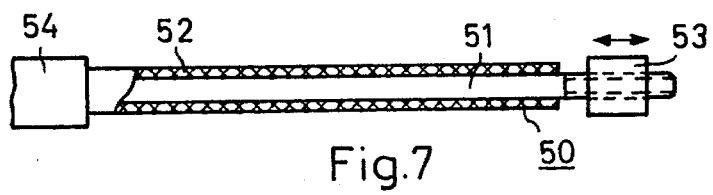
FIG. 7 is a cross-sectional view of still a further embodiment of a bi-axial supplemental oscillator constructed according to the present invention.

FIG. 7 shows a supplemental oscillator 50 which is fastened at one end to a holder 54. Supplemental oscillator 50 can be attached to a specimen holder by this holder and consists of a spring wire 51 which is surrounded over the larger part of its length by a jacket of any desired elastomer. The forward part of spring wire 51, which is not surrounded by jacket 52, has a thread onto which a nut 53 can be screwed. Nut 53 represents an additional weight which can be moved back and forth over a certain range along the length of supplemental oscillator 50. The resonance frequency of oscillator 50 can thereby be varied within certain limits and adapted to the resonance frequencies of the specimen holder more easily.

The present invention is applicable not only to electron microscopes such as these described previously herein, but also to ion microscopes or to electron or ion diffraction apparatus. In addition to the different specimen holders shown in the various embodiments of the invention, the vibration damper of the invention can also be attached to the vibrating parts of a mechanical goniometer, such as is used, for example, in scanning surface microscopes as a specimen holder. The vibration damper of the invention can also be used for all parts in the interior of a charged-particle beam optical apparatus which are not frictionally coupled to the apparatus and can therefore be excited to vibrations of their own. By using additional supplemental oscillators, resonant vibrations of higher order can also be suppressed.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense. What is claimed is:

1. In a charged-particle beam optical apparatus including a specimen holder which is mounted in at least one support member of the apparatus and vibrates when the support member is subjected to shock, the improvement comprising at least one damped oscillator means coupled to said specimen holder at approximately the point of maximum vibration amplitude of said specimen holder, to eliminate interfering soil vibrations within said specimen holder.

2. The improvement recited in claim 1, wherein said oscillator means comprises a damped uni-axial oscillator means.

3. The improvement recited in claim 1, wherein said oscillator means comprises a damped multi-axial oscillator means.

4. The improvement recited in claim 1, wherein said oscillator means comprises a bi-axial oscillator consisting of a resilient rod which is unilaterally coupled to said specimen holder and is surrounded by energy-consuming material disposed on said rod, the resonance frequency of said oscillator in the two axes thereof being approximately equal to the corresponding resonance frequencies of said specimen holder.

5. The improvement recited in claim 4, wherein said rod has a circular cross-section and said energy-consuming material comprises an elastomer tube disposed on said rod.

6. The improvement recited in claims 4 or 5, further comprising a weight member disposed on said rod near a free end thereof.

7. The improvement recited in claim 1, wherein said oscillator means comprises a tri-axial oscillator comprising a first rigid mass located in the center of a second mass which is resilient in all three axes and is fabricated of energy-consuming material, the resonance frequency of said oscillator in said individual axes being approximately equal to the corresponding resonance frequencies of said specimen holder.

* * * * *